(12) United States Patent
Arakelyan et al.

(10) Patent No.: US 11,869,749 B2
(45) Date of Patent: Jan. 9, 2024

(54) SUBSTRATE PROCESSING APPARATUS AND METHOD OF MANUFACTURING THEREOF

(71) Applicant: SEMES CO., LTD., Cheonan-si (KR)

(72) Inventors: Shant Arakelyan, Hwaseong-si (KR); Ja Myung Gu, Cheonan-si (KR); Jong Hwan An, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 46 days.

(21) Appl. No.: 16/600,554

(22) Filed: Oct. 13, 2019

(65) Prior Publication Data

US 2020/0118796 A1 Apr. 16, 2020

(30) Foreign Application Priority Data

Oct. 15, 2018 (KR) .................. 10-2018-0122793

(51) Int. Cl.
*H01J 37/32* (2006.01)
*H01L 21/683* (2006.01)

(52) U.S. Cl.
CPC .. *H01J 37/32183* (2013.01); *H01J 37/32642* (2013.01); *H01J 37/32715* (2013.01);
(Continued)

(58) Field of Classification Search
CPC .......... H01J 37/32183; H01J 37/32715; H01J 21/6833; H01J 37/32642; H01J 2237/332;
(Continued)

(56) References Cited

U.S. PATENT DOCUMENTS 6,039,836 A * 3/2000 Dhindsa ............ H01J 37/32623
156/345.1
2003/0201069 A1* 10/2003 Johnson ............ H01J 37/32642
156/345.43
(Continued)

FOREIGN PATENT DOCUMENTS

CN 101720501 6/2010
CN 101809719 8/2010
(Continued)

OTHER PUBLICATIONS

Engineering Design Handbook (1975)—Environmental Series, Part Five—Glossary of Environmental Terms: (AMCP 706-119)—capacitive coupling. U.S. Army Materiel Command (Year: 1975).*
(Continued)

*Primary Examiner* — Ram N Kackar
*Assistant Examiner* — Laureen Chan

(57) ABSTRACT

The substrate processing apparatus includes a process chamber providing a space for processing a substrate, a chuck member provided in the process chamber and supporting the substrate, a ring member provided to surround the chuck member, an edge electrode disposed in the ring member to be electrically insulated from the chuck member, an edge impedance controller electrically connected to the edge electrode and controlling an electric potential of the edge electrode, and a coupling compensator connected between the chuck member and the edge electrode and provided to cancel or adjust coupling between the chuck member and the edge electrode.

13 Claims, 9 Drawing Sheets

(52) U.S. Cl.
CPC .... H01L 21/6833 (2013.01); *H01J 2237/332* (2013.01); *H01J 2237/334* (2013.01)

(58) Field of Classification Search
CPC ............. H01J 2237/334; H01J 21/6831; H01J 21/68735; H01J 21/67109; H01J 37/32091; H01J 37/32174; H01J 37/32568; H01J 37/32532; H01J 21/68721; H01J 21/68785
See application file for complete search history.

(56) References Cited

U.S. PATENT DOCUMENTS

| | | | | |
|---|---|---|---|---|
| 2007/0215279 | A1* | 9/2007 | Koshiishi | H01J 37/32642 156/914 |
| 2009/0071938 | A1* | 3/2009 | Dhindsa | H01J 37/32568 216/67 |
| 2009/0223810 | A1* | 9/2009 | Dhindsa | H01J 37/32642 204/164 |
| 2010/0040768 | A1* | 2/2010 | Dhindsa | H01J 37/32724 427/248.1 |
| 2011/0011535 | A1 | 1/2011 | Dhindsa | |
| 2015/0170925 | A1 | 6/2015 | Chen et al. | |
| 2018/0025891 | A1 | 1/2018 | Marakhtanov et al. | |
| 2018/0102238 | A1 | 4/2018 | Gu et al. | |
| 2019/0013184 | A1* | 1/2019 | Cui | H01J 37/32174 |
| 2019/0304754 | A1* | 10/2019 | Shim | H03H 7/0115 |

FOREIGN PATENT DOCUMENTS

| | | |
|---|---|---|
| CN | 107665804 | 2/2018 |
| KR | 10-2016-0101021 | 8/2016 |
| KR | 10-2018-0011711 | 2/2018 |
| KR | 10-2018-0038596 | 4/2018 |

OTHER PUBLICATIONS

Office Action dated Dec. 9, 2021 by China National Intellectual Property Administration (CNIPA).

* cited by examiner

SUBSTRATE PROCESSING APPARATUS AND METHOD OF MANUFACTURING THEREOF

CROSS REFERENCE TO RELATED APPLICATION

The present application claims priority to Korean Patent Application No. 10-2018-0122793, filed Oct. 15, 2018, the entire contents of which is incorporated herein for all purposes by this reference.

BACKGROUND OF THE INVENTION

Field of the Invention

The present invention relates generally to a substrate processing apparatus that processes a substrate by using plasma and a substrate processing method.

Description of the Related Art

Generally, a substrate processing apparatus for processing a substrate such as a semiconductor wafer by using plasma such as an etching apparatus or a deposition apparatus includes a process chamber. Plasma may be generated in various methods, for example, radio frequency power is applied between an upper electrode and a lower electrode which are provided in the process chamber to generate plasma. The upper electrode may be an upper wall of the process chamber or a showerhead supplying process gas, and the lower electrode may be a chuck member supporting the substrate. Any one of the upper and lower electrodes may be connected to a radio frequency (RF) power source and the remaining one may be grounded. Occasionally, one or more radio frequency (RF) sources may be connected to both electrodes. The chuck member may be connected with a separate power source for accelerating ions to the substrate.

Meanwhile, a focus ring is conventionally disposed around the chuck member. The focus ring concentrates plasma on a substrate region, and may make a plasma characteristic and ion directivity in the center and an edge region of the substrate uniform. However, as plasma processing process is repeated, erosion of the focus ring due to ion bombardment proceeds, which acts as a factor in changing the plasma characteristic and the ion directivity.

In order to solve the above problem, the technique controlling edge impedance by providing an edge electrode around the chuck member has been proposed. The edge electrode is formed in a ring shape surrounding the chuck member, and insulator is inserted between the chuck member and the edge electrode. The edge electrode is connected with an edge impedance controller to adjust impedance. That is, a plasma sheath position may be controlled by adjusting an electric potential of the edge electrode by using the edge impedance controller. Through the edge impedance control technique, a change of the plasma characteristic in the edge region may be adjusted to some degree uniformly even when the focus ring is eroded.

However, in the technique, electrical coupling between the chuck member and the edge electrode is a problem. For example, when the electric potential of the edge electrode is adjusted low by the edge impedance controller for controlling the plasma sheath position in the edge region, power leakage occurs from the chuck member to the edge electrode, which may affect substrate processing speed and processing uniformity.

When a distance between the chuck member and the edge electrode is increased to reduce effect of the coupling, a region in which plasma sheath is adjusted by the edge impedance control is away from the edge of the substrate and thus edge impedance control efficiency is reduced.

Documents of Related Art (Patent Document 1) KR 10-2018-0038596 A

SUMMARY OF THE INVENTION

Accordingly, the present invention has been made keeping in mind the above problems occurring in the related art, and the present invention is intended to propose a substrate processing apparatus and a substrate processing method, wherein coupling between a chuck member and an edge electrode can be compensated.

Another objective of the present invention is to provide a substrate processing apparatus and a substrate processing method, wherein coupling between the chuck member and the edge electrode is minimized without increasing a distance therebetween, so that edge impedance control efficiency can be improved.

A further objective of the present invention is to provide a substrate processing apparatus and a substrate processing method, wherein a capacity of adjusting a plasma sheath in an edge region is improved, so that a maintenance period due to erosion of a focus ring can extend.

In order to achieve the above objectives, according to one aspect of the present invention, there is provided a substrate processing apparatus, the substrate processing apparatus includes: a process chamber providing a space for processing a substrate; a chuck member provided in the process chamber and supporting the substrate; a ring member provided to surround the chuck member; an edge electrode disposed in the ring member to be electrically insulated from the chuck member; an edge impedance controller electrically connected to the edge electrode and controlling an electric potential of the edge electrode; and a coupling compensator connected between the chuck member and the edge electrode and provided to cancel or adjust coupling between the chuck member and the edge electrode.

The coupling compensator may include an inductor and a variable capacitor that are connected to each other in parallel, and the coupling compensator constitutes a parallel resonance circuit together with capacitance between the chuck member and the edge electrode.

The coupling between the chuck member and the edge electrode may be canceled or adjusted by adjusting the variable capacitor of the coupling compensator, and the variable capacitor of the coupling compensator may be adjusted within a region where the coupling between the chuck member and the edge electrode is canceled or capacitive coupling occurs.

The substrate processing apparatus according to the embodiment of the present invention may include: a radio frequency (RF) power source applying RF power between an upper electrode and a lower electrode to generate plasma in the process chamber, wherein the chuck member may act as the lower electrode.

The chuck member may include a base plate and an electrostatic chuck that adheres to an upper portion of the base plate, and the RF power source may be electrically connected to the base plate.

The ring member may include: a first ring member provided to surround a circumference of the substrate that is supported by the chuck member; and a second ring member formed of an insulation material and disposed under the first ring member to surround a circumference of the chuck member. The first ring member may be a focus ring, and the edge electrode may be inserted into the second ring member so as to be electrically insulated from the chuck member by the second ring member.

The ring member may include a third ring member provided between the first ring member and the chuck member, the third ring member being formed of a metallic material.

In the embodiment of the present invention, electric potential of the edge electrode may be adjusted independently from the chuck member.

The substrate processing apparatus according to the embodiment of the present invention may include: a lower electrode to which a radio frequency (RF) power source is electrically connected for generating plasma; an edge electrode disposed to be electrically insulated from the lower electrode; and a coupling compensator connected between the lower electrode and the edge electrode and provided to cancel or adjust coupling between the lower electrode and the edge electrode.

The substrate processing apparatus may include a ring member formed of an insulation material and provided to surround the lower electrode, wherein the edge electrode may be electrically insulated from the lower electrode by the ring member.

The coupling compensator may be configured as a parallel resonance circuit in which a fixed inductor and a variable capacitor are connected to each other in parallel, and the coupling between the lower electrode and the edge electrode may be canceled or adjusted by adjusting the variable capacitor.

A substrate processing method according to another aspect of the present invention may be performed by processing a substrate by using the substrate processing apparatus. The substrate processing method may include: generating plasma by applying radio frequency (RF) power between the upper electrode and the lower electrode; adjusting the electric potential of the edge electrode; and canceling or adjusting coupling between the lower electrode and the edge electrode by using the coupling compensator.

The coupling compensator may include the inductor and the variable capacitor that are connected to each other in parallel, and the canceling or adjusting of the coupling between the lower electrode and the edge electrode by using the coupling compensator may include adjusting the variable capacitor.

The adjusting of the variable capacitor may be performed within a region in which capacitive coupling occurs between the lower electrode and the edge electrode.

According to the embodiments of the present invention, the coupling compensator is connected between the chuck member and the edge electrode. Therefore, the coupling occurring between the chuck member and the edge electrode can be canceled.

According to the embodiments of the present invention, the coupling compensator can minimize the coupling without increasing the distance between the chuck member and the edge electrode. Therefore, the edge impedance control efficiency can be improved.

According to the embodiments of the present invention, a degree of the coupling can be adjusted by adjusting the variable capacitor included in the coupling compensator. Therefore, the capacity of adjusting the plasma sheath in the edge region can be improved, thereby extending the maintenance period due to erosion of the focus ring.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Hereinbelow, the present invention will be described in detail with reference to the accompanying drawings. The following description includes detailed embodiments, but the present invention is not limited thereto. Further, when it is determined that the detailed description of the known art related to the present invention might obscure the gist of the present invention, the detailed description thereof will be omitted.

Figure 1:
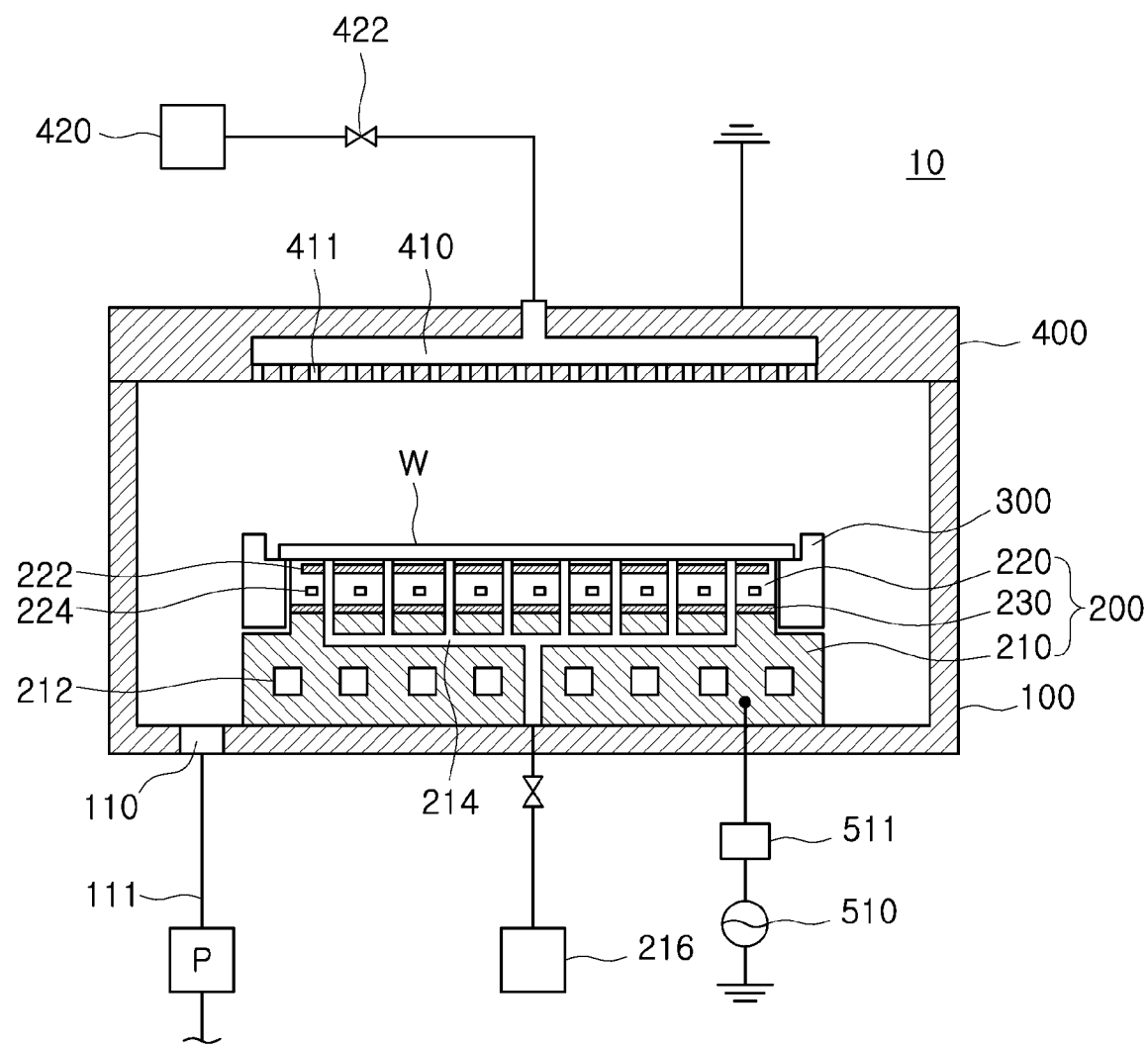
FIG. 1 is a schematic view showing a configuration of a substrate processing apparatus according to an embodiment of the present invention.

FIG. 1 is a schematic view showing a configuration of a substrate processing apparatus according to an embodiment of the present invention.

Referring to FIG. 1, the substrate processing apparatus 10 includes a process chamber 100, a chuck member 200, a ring member 300, and a gas injection unit 400.

The process chamber 100 provides an interior space in which a substrate processing process is performed. The substrate processing process may be performed under a vacuum environment, thus the process chamber 100 has an exhaust port 110. The exhaust port 110 is connected with a vacuum pump P by an exhaust line 111.

The gas injection unit 400 injects process gas for the substrate processing and includes a diffusion chamber 410 and a plurality of diffusion holes 411 that are connected with a process gas supply 420. The plurality of diffusion holes 411 is disposed on a surface facing a substrate W and injects the process gas supplied from the process gas supply 420 into the diffusion chamber 410 to an upper surface of the substrate W. A process gas supply valve 422 adjust flow rate of process gas supplied to the gas injection unit 400. Although the gas injection unit 400 is formed in a showerhead shape, the present invention is not limited thereto. For example, the process gas may be supplied into the process chamber 100 through a gas injection nozzle provided at a side wall of the process chamber 100.

The chuck member 200 is provided in the process chamber 100 to support the substrate W. The chuck member 200 may include an electrostatic chuck 220 for supporting the substrate W in an adhesion manner and a base plate 210 supporting the electrostatic chuck 220. The electrostatic chuck 220 and the base plate 210 may adhere to each other by a bonding layer 230, and the bonding layer 230 may be formed of silicone and the like.

The electrostatic chuck 220 may be formed of a dielectric plate such as alumina and the like, and may have a chuck electrode 222 therein for generating electrostatic force. When voltage is applied to the chuck electrode 222 by a power source omitted in the drawings, the electrostatic force is generated so that the substrate W is supported on the electrostatic chuck 220 in the adhesion manner. The electrostatic chuck 220 may include a heater 224 for heating the substrate W to a predetermined temperature.

The base plate 210 is disposed at a lower portion of the electrostatic chuck 220, and may be formed of a metallic material such as aluminum. The base plate 210 includes a refrigerant passage 212 therein through which cooling fluid flows so as to function as a cooling means cooling the electrostatic chuck 220. The refrigerant passage 212 may be provided as a circulation passage through which cooling fluid is circulated.

The chuck member 200 includes a heat transfer gas passage 214 to supply heat transfer gas from a heat transfer gas supply 216 to a rear surface of the substrate W. The heat transfer gas may make heat transfer between the base plate 210 and the substrate W more efficient, so that cooling of the substrate W may be accelerated.

The substrate processing apparatus 10 includes a plasma source for generating plasma. Plasma may be generated by various methods, for example, an inductively coupled plasma (ICP) method, a capacitively coupled plasma (CCP) method, or remote plasma may be used therein. A CCP device in FIG. 1, for example, may have a RF power source 510 for causing electric potential difference between an upper electrode and a lower electrode. In the configuration of the apparatus in FIG. 1, the gas injection unit 400 may act as the upper electrode, and the chuck member 200 may act as the lower electrode. That is, the gas injection unit 400 for the upper electrode is grounded, and the chuck member 200 for the lower electrode, especially, the base plate 210 may be electrically connected with the RF power source 510. A matching box 511 may be provided between the base plate 210 and the RF power source 510.

The ring member 300 is provided around the chuck member 200. The chuck member 200 and the ring member 300 together constitute a substrate support unit. The ring member 300 may concentrate plasma on a region where the substrate W is provided, and function as plasma to be distributed with a uniform density in a whole region of the substrate W. Whereby, substrate processing efficiency may be improved and uniform processing may be performed at both the center and an edge region of the substrate W.

Figure 2:
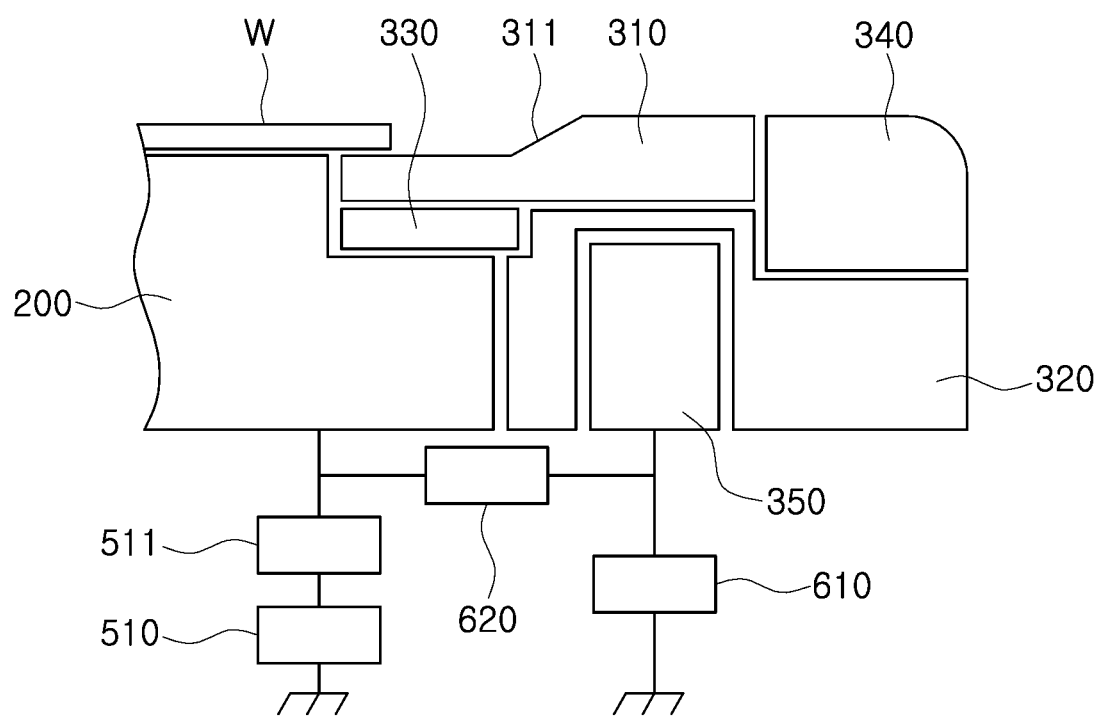
FIG. 2 is a schematic view showing partially a substrate support unit of the substrate processing apparatus according to the embodiment of the present invention.

FIG. 2 is a schematic view showing partially a substrate support unit of the substrate processing apparatus according to the embodiment of the present invention. A configuration of the substrate support unit will be described in detail with reference to FIG. 2.

As shown in FIG. 2, the substrate support unit according to the embodiment of the present invention may include the chuck member 200 and the ring member 300 surrounding the chuck member 200. The ring member 300 may include a first ring member 310, a second ring member 320, a third ring member 330, and a fourth ring member 340.

The first ring member 310 is disposed such that an upper surface thereof is at almost the same level as an upper surface of the chuck member 200. However, a step portion 311 is formed in the first ring member 310 in a width direction of the first ring member, so that the first ring member 310 may surround a circumference of the substrate W that adheres to the chuck member 200. The first ring member 310 may be a focus ring. The focus ring may allow ions generated during the plasma process to be concentrated on the substrate W.

The second ring member 320 may be disposed under the first ring member 310 to surround a circumference of the chuck member 200. The second ring member 320 may be formed of an insulation material. The second ring member 320 may separate the chuck member 200 from an exterior wall of the process chamber 100, and may electrically insulate the first ring member 310 from modules provided at a lower portion of the chuck member 200.

When necessary, the third ring member 330 of a metallic material may be provided between the first ring member 310 and the chuck member 200. In addition, the fourth ring member 340 of an insulation material may be provided to surround an outer circumferential surface of the first ring member 310.

The present invention is not limited to the configuration of the ring member 300 in FIG. 2, and various modifications thereof will be possible. For example, the second ring member 320 and the fourth ring member 340 may be provided as one configuration that is not divided into two members.

An edge electrode is disposed in the ring member so as to be electrically insulated from the chuck member. Specifically, the edge electrode 350 may be inserted into the second ring member 320. That is, the edge electrode 350 is disposed around the chuck member 200 to be electrically insulated from the chuck member 200, the first ring member 310, and the third ring member 330. The insulation may be provided by the second ring member 320. The edge electrode 350 may be foamed in a ring shape, and may be formed of a conductivity material. For example, the edge electrode 350 may be formed of a metal ring.

The edge electrode 350 may be electrically connected with an edge impedance controller 610. The edge impedance controller 610 may control a plasma sheath position and ion directivity by adjusting an electric potential of the edge electrode 350. Therefore, uniform plasma processing to the substrate edge region may be possible. The edge impedance controller 610 may include a variable capacitor.

Figure 3:
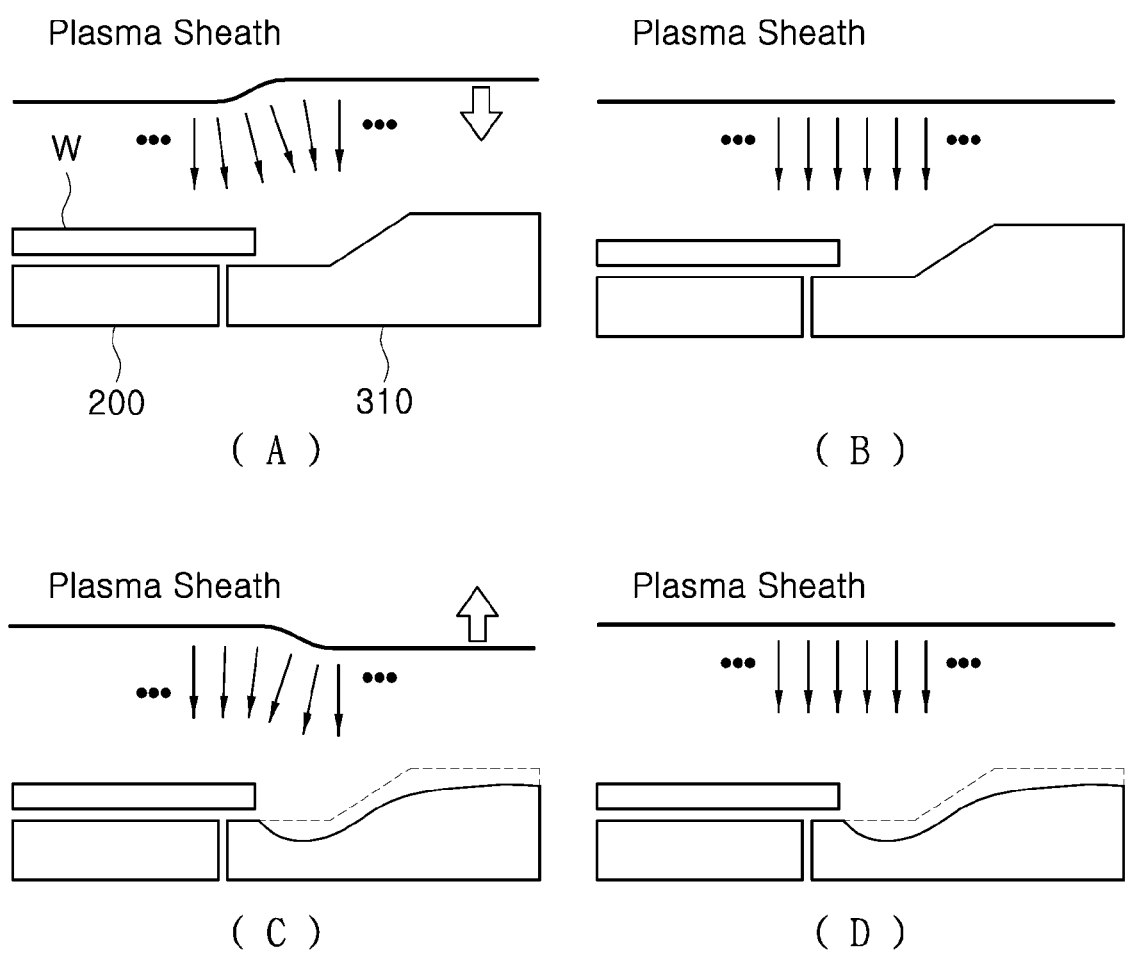
FIGS. 3A to 3D are concept views showing control of a plasma sheath in an edge region.

The control using the edge electrode 350 and the edge impedance controller 610 may be efficiently applied even when the first ring member 310 is eroded by repeated exposure to plasma. Referring to FIG. 3, the chuck member 200, the substrate W, and the first ring member 310 are partially shown in FIG. 3.

Referring FIG. 3A, the plasma sheath position in the substrate edge region is not uniform, and the ion directivity of which ions are accelerated through the plasma sheath is not uniform. In this state, through the adjustment using the edge impedance controller 610 as shown in FIG. 3B, the plasma sheath position may be made uniform and the ion directivity may be perpendicular to the substrate W. Meanwhile, when the first ring member 310 is eroded, the plasma sheath position and the ion directivity may require adjustment again as shown in FIG. 3C. Since the edge impedance controller 610 is used to adjust the plasma sheath position in the edge region so as to raise the plasma sheath position, the plasma sheath position and the ion directivity may be adjusted again uniformly even when the first ring member 310 is eroded, as shown in FIG. 3D.

Meanwhile, the edge electrode 350 is electrically insulated from the chuck member 200 by the second ring member 320, but in most cases, the edge electrode 350 is disposed close enough to the chuck member 200 not to avoid electrical coupling. Accordingly, in an exemplary case in which the electric potential of the edge electrode 350 is adjusted low by the edge impedance controller 610, power leakage may occur due to the electric potential difference caused between the edge electrode 350 and the chuck member 200. That is, power that is applied from the RF power source 510 to the chuck member 200 for generating plasma may be leaked to the edge electrode 350 adjusted to a relatively low electric potential. This may affect substrate processing speed and processing uniformity.

According to the embodiment of the present invention, the substrate processing apparatus is provided with a coupling compensator 620 electrically connected between the chuck member 200 and the edge electrode 350 for compensating the coupling. The coupling compensator 620 includes an inductor and the variable capacitor, and may be a parallel resonance circuit connected in parallel with capacitance between the chuck member 200 and the edge electrode 350.

Figure 4:
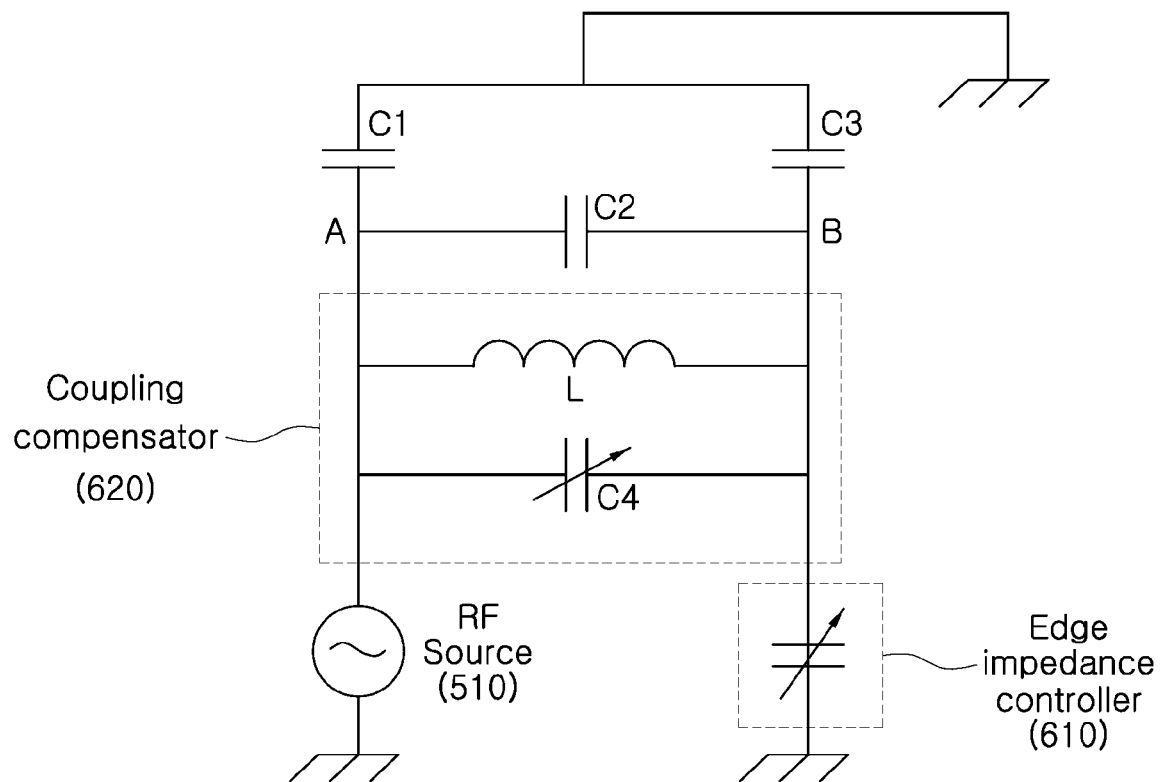
FIG. 4 is a circuit diagram of substrate processing apparatus according to the embodiment of the present invention.

A configuration of the coupling compensator 620 will be described in detail with reference to FIG. 4. FIG. 4 is an equivalent circuit of another substrate processing apparatus of the embodiment of the present invention. In FIG. 4, C1 is capacitance between the chuck member 200 and an upper electrode (gas injection unit 400 in example of the FIG. 1), C2 is capacitance between the chuck member 200 and the edge electrode 350, C3 is capacitance between the edge electrode 350 and the upper electrode. The edge electrode 350 is electrically connected with the edge impedance controller 610, and the chuck member 200 is connected with a RF power source 510. The edge impedance controller 610 may include the variable capacitor. In FIG. 4, A and B correspond to positions of a lower electrode (chuck member) and the edge electrode 350, respectively.

The coupling compensator 620 may include one fixed inductor and the variable capacitor. Referring to FIG. 4, the coupling compensator 620 is configured by connecting the one fixed inductor L and the one variable capacitor in parallel, and the coupling compensator 620 and C2 together constitute the parallel resonance circuit. According to this configuration, the coupling between the chuck member 200 and the edge electrode 350 may be closed and power leakage occurring between the chuck member 200 and the edge electrode 350 may be prevented by adjusting C4 capacitance of the variable capacitor included in the coupling compensator 620.

In addition, since the coupling between the chuck member 200 and the edge electrode 350 is closed, the electric potential of the edge electrode 350 may be adjusted without affecting the electric potential of the chuck member 200 and without placing the chuck member 200 away from the edge electrode 350. This means that a capacity of adjusting the plasma sheath is improved. Therefore, when plasma characteristic in the edge region is changed due to erosion of the first ring member 310, the region where the plasma sheath may be adjusted may expand by using the edge impedance controller 610.

Figure 5:
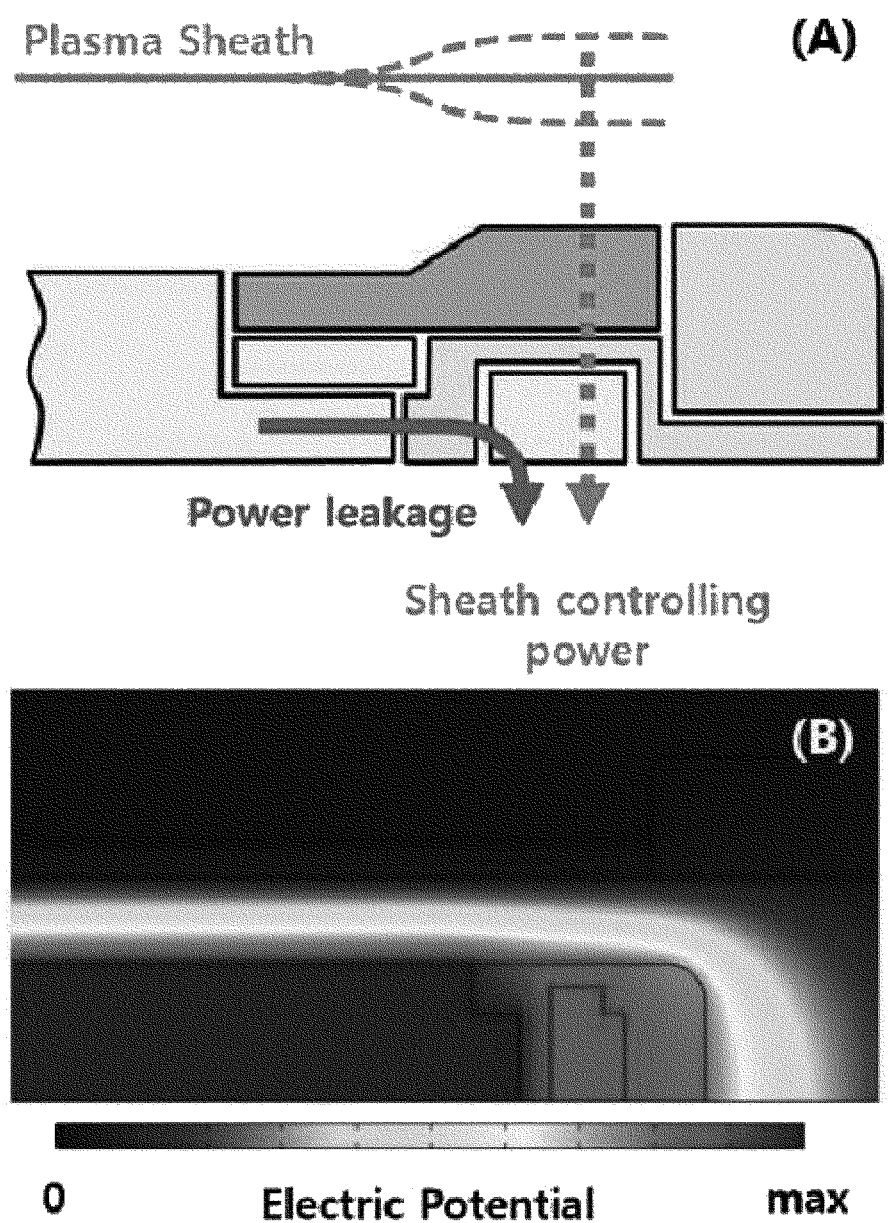
FIG. 5 is a view showing an effect of a comparative example without a coupling compensator.
Figure 6:
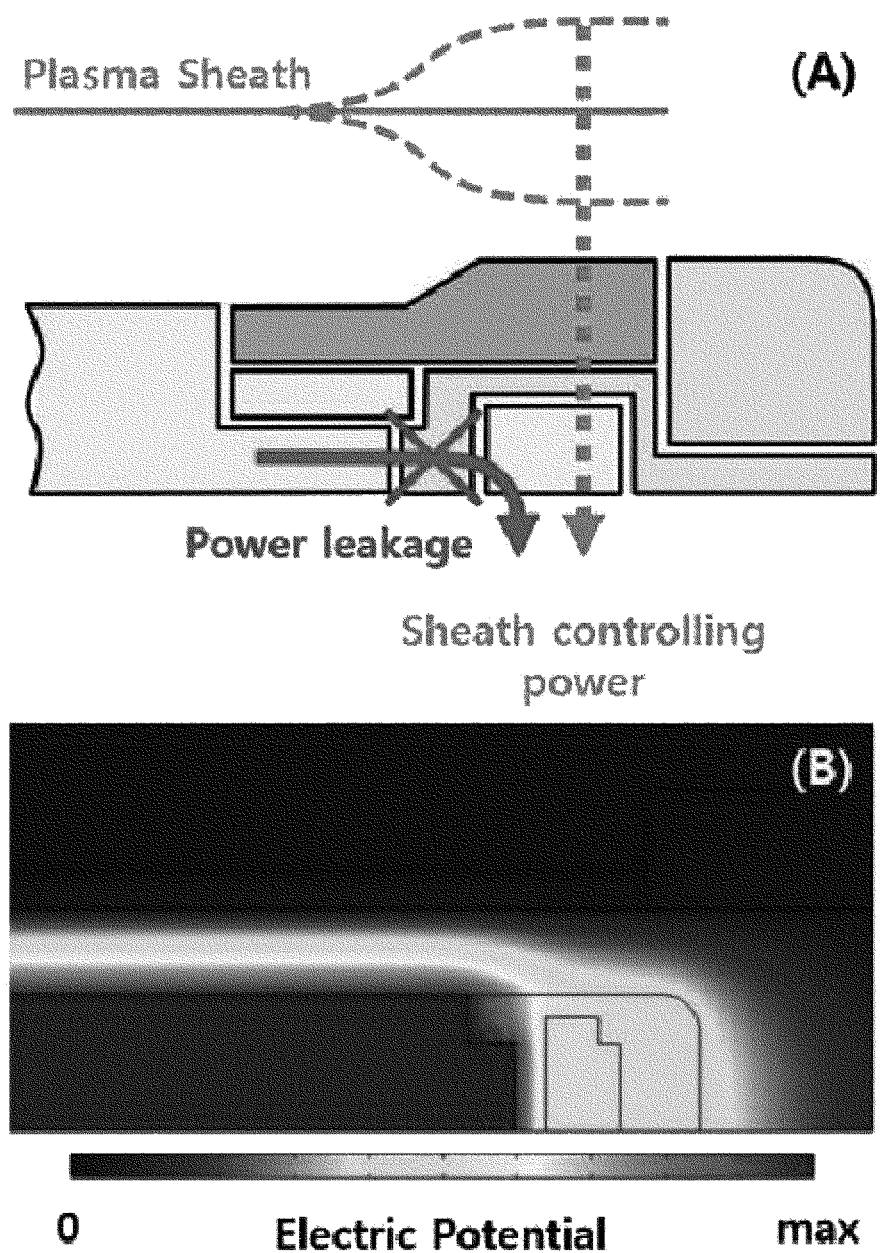
FIG. 6 is view showing an effect of the embodiment with the coupling compensator.

FIGS. 5 and 6 are views showing an effect of the coupling compensator 620, FIG. 5 is a view showing a comparative example without the coupling compensator 620; and FIG. 6 is view showing the embodiment with the coupling compensator 620. FIGS. 5A and 6A are schematic views showing the capacity of adjusting the plasma sheath by edge impedance control and the power leakage from the chuck member 200 to the edge electrode 350. FIGS. 5B and 6B are views showing electromagnetic simulation results near the chuck member 200 and the edge electrode 350.

Referring to FIG. 5 showing the comparative example without the coupling compensator 620, when the electric potential of the edge electrode 350 is reduced for adjusting the plasma sheath position, the power leakage occurs from the chuck member 200 to the edge electrode 350. Thus, an electric potential adjustment range of the edge electrode 350 is limited, which causes relative degradation of the capacity of adjusting the plasma sheath.

On the other hand, referring to FIG. 6 showing the embodiment with the coupling compensator 620, the coupling between the chuck member 200 and the edge electrode 350 may be closed, thus power leakage from the chuck member 200 to the edge electrode 350 may be prevented. In addition, the electric potential of the edge electrode 350 may be adjusted independently from the chuck member 200, thus the electric potential adjustment range of the edge electrode 350 expands. This causes relative improvement of the capacity of adjusting the plasma sheath.

Improved capacity of adjusting the plasma sheath means that the ion directivity may be adjusted over a wider range. According to the embodiment of the present invention, a maintenance period due to erosion of the first ring member 310 may be further extended. That is, uniform substrate processing may be possible by the edge impedance control without maintenance even until the first ring member 310 is eroded more severely.

FIGS. 5B and 6B show that the electric potential of the edge electrode 350 may be adjusted independently from the chuck member 200 by the coupling compensator 620. In the case of FIG. 5B without the coupling compensator 620, there is not a significant difference between electric potentials of the chuck member 200 and the edge electrode 350. However, in the case of FIG. 6B in which the coupling is closed by the coupling compensator 620, there is clear difference between the electric potentials of the chuck member 200 and the edge electrode 350.

According to the embodiment of the present invention, a degree of the coupling between the chuck member 200 and the edge electrode 350 may be easily adjusted by adjusting the variable capacitance C4 of the coupling compensator 620. In this case, compared to control using only the edge impedance controller 610, a range in which the plasma characteristic and the substrate processing in the substrate edge region may be controlled depending on a user's intent.

Figure 7:
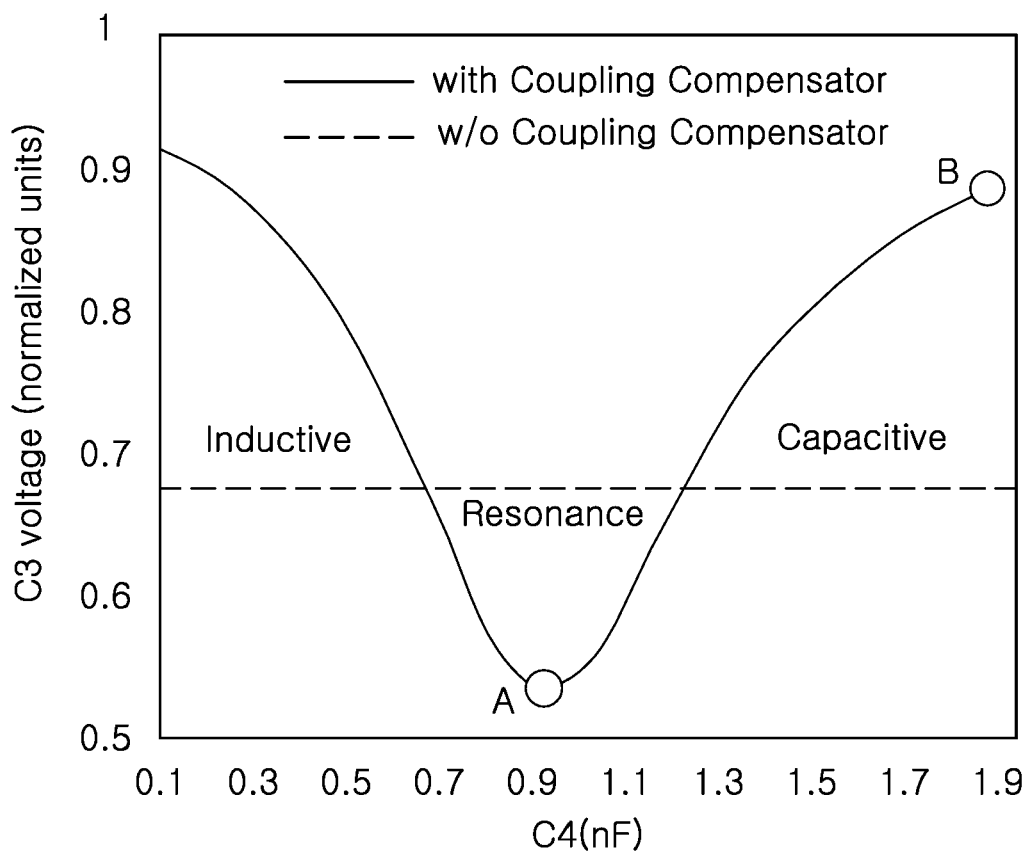
FIG. 7 is a graph showing that the coupling compensator may adjust a degree of coupling between a chuck member and an edge electrode.

FIG. 7 is a graph showing that the coupling compensator 620 may adjust the degree of the coupling between the chuck member 200 and an edge electrode 350. Referring to FIG. 7, unlike the comparative example (indicated by dotted line) without the coupling compensator 620, a C3 voltage is changed by adjusting the C4 capacitance of the variable capacitor of the coupling compensator 620. The C3 voltage is a voltage at opposite ends of the C3 capacitance, that is, a voltage between the edge electrode 350 and the upper electrode.

The C3 voltage may be adjusted from a low C3 voltage (point A) to a high C3 voltage (point B) by controlling the coupling compensator, the points A and B are not reachable when the coupling compensator 620 is not provided. The change in the C3 voltage means a change in the plasma sheath and the ion directivity, which indicates that the capacity of adjusting the plasma sheath and the ion directivity is improved by controlling the coupling compensator 620.

The coupling between the chuck member 200 and the edge electrode 350 is minimized at the point A in FIG. 7 and then the coupling is increased again as the C4 capacitance is reduced and increased. When the C4 capacitance is increased from the point A, capacitive coupling occurs, and when the C4 capacitance is reduced, inductive coupling occurs. In order to adjust the coupling by adjusting the C4 capacitance, it is preferable to use a region of the capacitive coupling rather than a region of the inductive coupling in which there is a risk of induction heat. That is, it is preferable that the C4 capacitance is adjusted within a region in which the voltage C3 is increased with a positive slope (+), depending on the change of the C4 capacitance.

Figure 8:
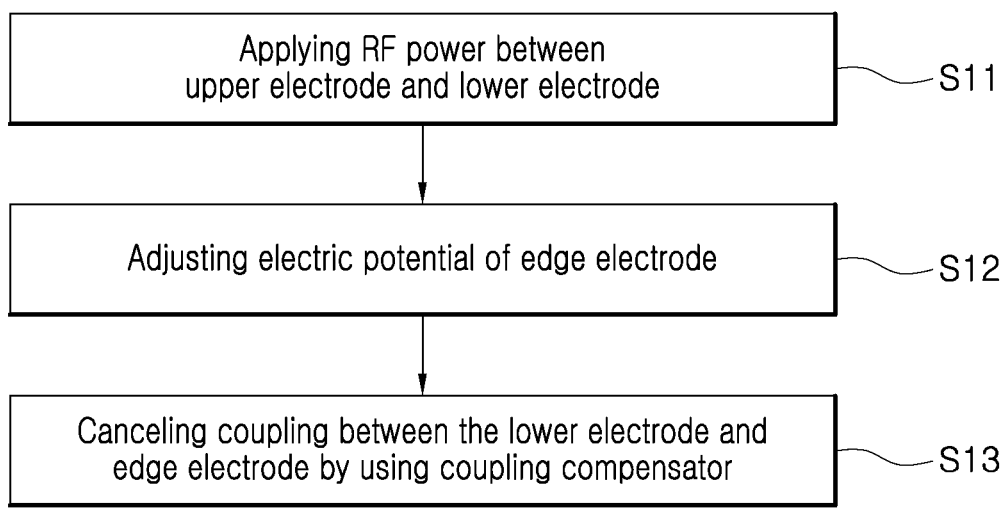
FIGS. 8 and 9 are flowcharts showing a substrate processing method according to the embodiment of the present invention.

FIG. 8 is a flowchart showing a substrate processing method according to the embodiment of the present invention.

Referring to FIG. 8, the substrate processing method according to the embodiment of the present invention includes: applying RF power between the upper electrode and the lower electrode S11; adjusting the electric potential of the edge electrode S12'; and canceling the coupling between the lower electrode and the edge electrode by using the coupling compensator S13.

The applying of RF power between the upper electrode and the lower electrode S11 is a step in which plasma is generated in the process chamber for the substrate processing. The upper electrode may be an upper wall of the process chamber or a gas injection unit such as a showerhead supplying process gas, and the lower electrode may be the chuck member.

S12 is performed such that the electric potential of the edge electrode is adjusted, and may be performed by using the edge impedance controller that is electrically connected to the edge electrode. At this point, the electric potential of the edge electrode may be adjusted by adjusting the variable capacitor included in the edge impedance controller.

When the electric potential of the edge electrode is adjusted in S12, power leakage may occur due to the electric potential difference between the lower electrode and the edge electrode. S13 is performed such that the coupling between the lower electrode and the edge electrode is canceled by using the coupling compensator. Through S13, the electric potential of the edge electrode may be adjusted independently from the lower electrode. The coupling compensator may be the configuration in which the one fixed inductor and the one variable capacitor are connected to each other in parallel as shown in FIG. 4, and may constitute the parallel resonance circuit together with the C2 capacitance between the lower electrode and the edge electrode. In order to cancel the coupling between the lower electrode and the edge electrode, the variable capacitor included in the coupling compensator may be adjusted.

Each of steps from S11 to S13 in FIG. 8 is not necessarily performed sequentially, but may be performed in a different order or in parallel. In addition, even when the lower electrode and the edge electrode are provided close to each other, uniform plasma processing may be possible without a problem of power leakage due to the coupling, by performing the steps.

Figure 9:
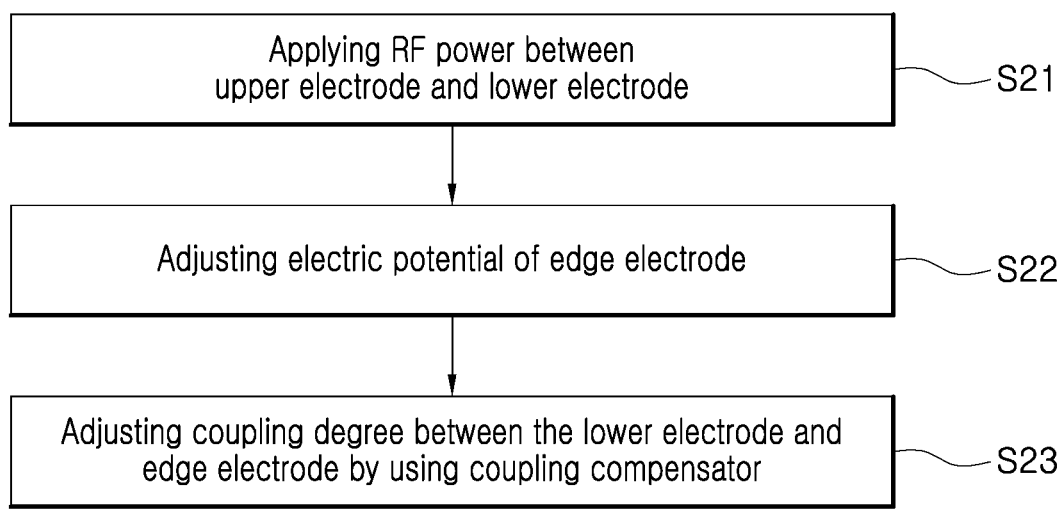

FIG. 9 is a flowchart showing a substrate processing method according to another embodiment of the present invention. The substrate processing method includes: applying RF power between the upper electrode and the lower electrode S21; adjusting the electric potential of the edge electrode S22; and adjusting the degree of the coupling between the lower electrode and the edge electrode using the coupling compensator S23. Steps of S21 and S22 in FIG. 9 are the same as the steps of Sll and S12 in FIG. 8.

S23 is performed such that the degree of the coupling between the lower electrode and the edge electrode is adjusted by adjusting the coupling compensator. When erosion of the first ring (focus ring) is severe and it is difficult to make the plasma sheath and the ion directivity uniform only by adjusting the electric potential of the edge electrode by the edge impedance controller, the degree of the coupling between the lower electrode and the edge electrode is adjusted by the coupling compensator, and thus the plasma sheath and the ion directivity in the edge region may be controlled more uniform. The coupling compensator may be the configuration in which the one fixed inductor and the one variable capacitor are connected to each other in parallel as shown in FIG. 4, and may constitute the parallel resonance circuit together with the C2 capacitance between the lower electrode and the edge electrode. The variable capacitor included in the coupling compensator may be adjusted to adjust the degree of the coupling between the lower electrode and the edge electrode.

S23 may be performed by adjusting the degree of coupling from the point where the coupling between the lower electrode and the edge electrode is canceled in the direction where the variable capacitance of the coupling compensator is increased. That is, the degree of coupling may be adjusted within the region where the capacitive coupling occurs between the lower electrode and the edge electrode. Accordingly, the degree of coupling may be adjusted without the risk of causing the induction heat.

Although preferred embodiments of the present invention has been described for illustrative purposes, those skilled in the art will appreciate that various modifications, additions and substitutions are possible, without departing from the scope and spirit of the invention as disclosed in the accompanying claims. Each of embodiments may be embodied in whole or may be partially and selectively embodied in combination. Therefore, the scope of the protection of the present invention should be defined by the claims and equivalents thereof.

What is claimed is:

1. A substrate processing apparatus comprising:
a process chamber providing a space for processing a substrate;
a chuck member provided in the process chamber and supporting the substrate;
a radio frequency (RF) power source applying RF power between an upper electrode and a lower electrode to generate plasma in the process chamber, wherein the lower electrode includes the chuck member;
a ring member provided to surround the chuck member;
an edge electrode disposed in the ring member to be electrically insulated from the chuck member;
an edge impedance controller electrically connected to the edge electrode and controlling an electric potential of the edge electrode; and
a coupling compensator connected between the chuck member and the edge electrode and configured to prevent the RF power applied to the chuck member from leaking to the edge electrode and to enable the edge impedance controller to control the electric potential of the edge electrode independently from the chuck member by canceling or adjusting a capacitive coupling between the chuck member and the edge electrode, wherein the coupling compensator includes a first connection point directly connected to the chuck member and a second connection point directly connected to the edge electrode, wherein the edge impedance controller includes a first connection point electrically grounded and a second connection point directly connected to the edge electrodes, wherein the ring member comprises:

a first ring member provided to surround a circumference of the substrate that is supported by a first portion of the chuck member;

a second ring member formed of an insulation material and disposed under the first ring member to surround a circumference of the first portion of the chuck member; and a third ring member vertically disposed between a lower surface of the first ring member and a second portion of the chuck member, and horizontally disposed between the first portion of the chuck member and a side portion of the second ring member, wherein the lower surface of the first ring member covers an entire upper surface of the third ring member, and wherein the entire upper surface of the third ring member is positioned at the same height as an uppermost surface of the second ring member.

2. The substrate processing apparatus of claim 1, wherein the coupling compensator includes an inductor and a variable capacitor that are connected to each other in parallel.

3. The substrate processing apparatus of claim 2, wherein the coupling compensator constitutes a parallel resonance circuit together with capacitance between the chuck member and the edge electrode.

4. The substrate processing apparatus of claim 1, wherein the chuck member comprises a base plate and an electrostatic chuck that is attached to an upper portion of the base plate, and the RF power source is electrically connected to the base plate.

5. The substrate processing apparatus of claim 1, wherein the first ring member is a focus ring.

6. The substrate processing apparatus of claim 1, wherein the edge electrode is inserted into the second ring member so as to be electrically insulated from the chuck member by the second ring member.

7. The substrate processing apparatus of claim 3, wherein the coupling between the chuck member and the edge electrode is canceled or adjusted by adjusting the variable capacitor of the coupling compensator.

8. The substrate processing apparatus of claim 7, wherein the variable capacitor of the coupling compensator is adjusted within a region where the coupling between the chuck member and the edge electrode is canceled or capacitive coupling occurs.

9. The substrate processing apparatus of claim 1, wherein the coupling compensator comprises an inductor and a variable capacitor that are connected to each other in parallel, and the variable capacitor is adjusted to cancel or adjust the capacitive coupling between the lower electrode and the edge electrode.

10. The substrate processing apparatus of claim 9, wherein the variable capacitor is adjusted within a region where the capacitive coupling occurs between the lower electrode and the edge electrode.

11. A substrate processing apparatus comprising:

a lower electrode to which a radio frequency (RF) power source is electrically connected for generating plasma;

an edge electrode electrically insulated from the lower electrode;

an edge impedance controller electrically connected to the edge electrode to control an electrical potential of the edge electrode;

a coupling compensator connected between the lower electrode and the edge electrode and configured to prevent the RF power applied to the lower electrode from leaking to the edge electrode and to enable the edge impedance controller to control the electric potential of the edge electrode independently from the lower electrode by canceling or adjusting a capacitive coupling between the lower electrode and the edge electrode; and a ring member configured to prevent the edge electrode from being exposed to the plasma: wherein the ring member comprises:

a first ring member provided to surround a circumference of a substrate that is supported by a first portion of the lower electrode;

a second ring member formed of an insulation material and disposed under the first ring member to surround a circumference of the first portion of lower electrode; and a third ring member vertically disposed between a lower surface of the first ring member and a second portion of the lower electrode, and horizontally disposed between the first portion of the lower electrode and a side portion of the second ring member, wherein the lower surface of the first ring member covers an entire upper surface of the third ring member, and wherein the entire upper surface of the third ring member is positioned at the same height as an uppermost surface of the second ring member.

12. The substrate processing apparatus of claim 11, wherein the edge electrode is electrically insulated from the lower electrode by the second ring member.

13. The substrate processing apparatus of claim 11, wherein the coupling compensator is configured as a parallel resonance circuit in which a fixed inductor and a variable capacitor are connected to each other in parallel, and the coupling between the lower electrode and the edge electrode is canceled or adjusted by adjusting the variable capacitor.

* * * * *